United States Patent [19]
Jacquinot et al.

[11] Patent Number: 6,126,518
[45] Date of Patent: Oct. 3, 2000

[54] CHEMICAL MECHANICAL POLISHING PROCESS FOR LAYERS OF SEMICONDUCTOR OR ISOLATING MATERIALS

[75] Inventors: Eric Jacquinot, Trosly Breuil; Maurice Rivoire, Meylan; Catherine Euvrard, Saint Martin d'Heres, all of France

[73] Assignee: Clariant (France) S.A., Puteaux, France

[21] Appl. No.: 09/054,518

[22] Filed: Apr. 3, 1998

[30] Foreign Application Priority Data

Apr. 7, 1997 [FR] France .................................. 97 04207

[51] Int. Cl.⁷ ........................................................ B24B 1/00
[52] U.S. Cl. ............................................... 451/41; 451/288
[58] Field of Search ........................ 451/41, 36, 285–289, 451/93, 37

[56] References Cited

U.S. PATENT DOCUMENTS

| Re. 35,420 | 1/1997 | Cathey et al. | 437/228 |
|---|---|---|---|
| 2,744,001 | 5/1956 | Harman et al. | 51/308 |
| 2,865,782 | 12/1958 | Strassburg | 106/308 |
| 3,170,273 | 2/1965 | Walsh et al. | |
| 3,208,823 | 9/1965 | Baker et al. | 23/182 |
| 3,715,842 | 2/1973 | Tredinnick et al. | 51/281 |
| 4,117,093 | 9/1978 | Brunner et al. | |
| 4,664,679 | 5/1987 | Kohyama et al. | |
| 5,395,801 | 3/1995 | Doan et al. | 437/225 |
| 5,575,706 | 11/1996 | Tsai et al. | 451/41 |

FOREIGN PATENT DOCUMENTS

| 0 363 100 | 5/1990 | European Pat. Off. |
| 0 684 638 | 11/1995 | European Pat. Off. |
| 0 745 656 | 12/1996 | European Pat. Off. |

OTHER PUBLICATIONS

Sugimoto, F. et al., "A pH controlled chemical mechanical polishing method for ultra–thin bonded soi wafer." Digest of the Technical Papers of the Symposium on VLSI Technology, Japan, May 1993.

Primary Examiner—David A. Scherbel
Assistant Examiner—Anthony Ojini
Attorney, Agent, or Firm—Browdy and Neimark

[57] ABSTRACT

Chemical mechanical polishing process for a layer of semiconductor material such as polycrystalline silicon, epitaxial single-crystal silicon, amorphous silicon or an isolating material such as phosphosilicate glass or borophosphosilicate glass used in the microelectronics semiconductors industry, with the exception of the initial silicon used in the manufacture of wafers for integrated circuits, in which an abrasion of the layer of semiconductor material or isolating material is carried out by rubbing the said layer with a fabric impregnated with an abrasive composition, the abrasive consisting of an aqueous suspension having a neutral pH or a pH close to neutrality of individualised colloidal silica particles, not linked together by siloxane bonds, and water as the suspension medium.

15 Claims, 2 Drawing Sheets

CHEMICAL MECHANICAL POLISHING PROCESS FOR LAYERS OF SEMICONDUCTOR OR ISOLATING MATERIALS

The present invention relates to a new chemical mechanical polishing process for semiconductor or isolating materials used in the manufacture of integrated circuits.

The construction of integrated circuits calls upon two successive crafts, separate from one another.

A first craft consists in the manufacture of wafers for integrated circuits, that is to say the manufacture of silicon slices. It is therefore in this type of industry that a silicon crystal is grown which is then cut into wafers of about 750 micrometres thickness, which are then subjected to a polishing in order to obtain a wafer of pure polished silicon. This type of industry does not however manufacture integrated circuits and these wafers for integrated circuits are sold to manufacturers of integrated circuits. U.S. Pat. No. 3,170,273, U.S. Pat. No. 4,664,679, U.S. Pat. No. 4,117,093 and EP-A-0,684,638 describe the polishing of the initial silicon wafers obtained from a solid bar of crystal which is cut in order to obtain wafers for integrated circuits.

The second craft, that of integrated circuit manufacturers, consist in then producing the integrated circuits, starting with the wafers for integrated circuits obtained from the previously mentioned industrials. The production integrated circuits in particular implies the follow stages:

Firstly, the whole of the surface of the wafers for integrated circuits is oxidised in order to obtain an isolating layer. Photolithography of the oxide layer is then carried out in order to etch the latter in such a way as to reach the silicon. The zones thus deeply etched are called active zones. At the locations of these active zones a new oxidation called "grid oxidation" is carried out. A layer, for example of doped polycrystalline silicon is then placed which constitutes the grid. An isolator is then deposited and another photolithography is carried in order again reach the level of the original silicon. In these locations, a deposit of metal such as tungsten is then produced. The present invention relates to polishing at this level of construction of integrated circuits, and at subsequent levels. In fact, it is at present possible to produce up to six contact levels involving deep etching at each level provided with deposits and then level regulation by an operation of polishing the metal and the isolator according to the present invention. The present invention does not however relate to the primary polishing of the wafers for integrated circuits.

As has been seen above, steps of variable height are principally generated by etching stages, which are therefore deep, followed by a regular deposit. Reduction in the dimensions of transistors requires these reliefs to be planarized because they can cause difficulties of alignment (focusing during photolithography), problems of continuity of materials during deposits or residues of materials during the etching of these materials. For sub-micron technologies, planarization is principally carried out by chemical mechanical polishing of the various deposited layers. The thickness remaining after polishing these isolating, semiconductor or conductive deposits have an effect on the electrical characteristics of the integrated circuits.

The manufacture of integrated circuits is carried out, at present, on wafers of diameter 200 mm, with 50 to 200 circuits per wafer depending on their size.

As the characteristics of integrated circuits have to be reproduced whatever their position on the wafer may be, uniformity of the different technical stages is essential. In particular, good uniformity of chemical mechanical polishing of the wafer makes it possible to prevent the excess local polishing of materials able to result in destruction of the circuits or in variations of the electrical characteristics of the integrated circuits depending on their position on the wafer.

The increasing integration of integrated circuits has therefore necessitated the development of new technologies such as chemical mechanical polishing applied to the planarization of surfaces comprising patterns in relief.

That is why during the present day operations of manufacturing integrated circuits, there is a requirement to polish principally no longer just the silicon of the integrated circuit wafers, but also other compositions of integrated circuit wafers like silicon oxide and certain metals such as tungsten. The polishing processes for these latter materials are well mastered.

But, on the other hand, the chemical mechanical polishing processes for semiconductor materials such as polycrystalline silicon, epitaxial single-crystal silicon, amorphous silicon or isolating materials such as phosphosilicate glass, (more commonly called PSG) or borophosphosilicate glass (more commonly called BPSG) are still very poorly mastered because of the non-existence of abrasives suitable for these various materials.

These materials are used in the microelectronics industry of semiconductors in epitaxial layers, (epitaxial silicon) or deposited layers (polycrystalline silicon and amorphous silicon, PSG and BPSG), at different stages of the manufacture of integrated circuits.

The development of a specific abrasive for polishing these materials of integrated circuit wafers is therefore fundamental for the mastery of their polishing processes.

In the literature, there has also been described the polishing of polycrystalline silicon using aqueous suspensions of colloidal silica of basic pH, most often between pH 9 and pH 12.5. The pH of these aqueous suspensions of colloidal silica have been made basic by the addition of alkaline hydroxide of metals such as sodium or potassium, or by the addition of a soluble amine in water (in particular see M. T. Bohr et al, WO-A-9627206, M. Motoshu et al, U.S. Pat. No. 5,376,222, A. V. Gelatos et al, U.S. Pat. No. 5,324,690, R. L. Lachappelle, U.S. Pat. No. 3,328,141, S.Yamamichi et al, JP-A-07074313, M. Watanabe et al, JP-A-072499600.

The use of such basic aqueous suspensions has a certain number of disadvantages. Poor uniformity of polishing is obtained, particularly at the edges of the wafer to be polished, (the English term "wafer" commonly used).

EP-A-0.745.656 describes the polishing of infinitesimal isolators on a semiconductor substrate using an abrasive composition containing a mixture of aluminium oxide, silica and cerium oxide in the presence of a stabilising agent.

EP-A-0.363 100 describes the selected polishing between a surface comprising $Si_3N_4$ and a surface more easily treatable than $Si_3N_4$ using a colloidal silica of 95.3% purity and free of ammonia because of the disadvantages introduced by the latter in the selectivity of the polishing.

The applicant's principal purpose was to develop a polishing process which procures an improvement in the uniformity of polishing of layers of the previously mentioned materials installed on integrated circuit wafers, used as semiconductors or isolators in the manufacture of integrated circuits.

It is necessary to state that the polishing will be able to be carried out on solid wafer (see FIGS. 1a and 1b) or on wafer with reliefs (see FIGS. 1c and 1d), in order to planarize these reliefs.

The materials to which the invention is applied are, as seen above, materials based on silicon or on doped silicon such as polycrystalline silicon, epitaxial silicon, amorphous silicon, phosphosilicate glass, or borophosphosilicate glass, the last two being based on doped silicon oxide, excluding the initial silicon used in the manufacture of wafers for integrated circuits.

In order to achieve all of these improvements in the chemical mechanical polishing of the layers of the above materials, it has been surprising and unexpectedly observed that the use of a suspension of colloidal silica, in particular a suspension containing (or preferably essential consisting of) fine individualised particles of silica not linked together by siloxane bonds and used in a neutral medium or one close to neutrality has, made it possible to improve considerably the uniformity of polishing whilst retaining a good speed of attack, an excellent planarization and surface qualities, in particular the virtual absence of roughness. In the present application and in the following text, the term "essentially" will refer to more than 50% "notably" will refer to more than 60%, particularly will refer to more 80%, and more particularly will refer to more than 90% and very particularly will refer to more 99%.

That is why the purpose of the present invention is the use of an abrasive which comprises an aqueous suspension of neutral pH or of pH close to neutrality of colloidal silica preferably containing individualised particles of colloidal silica, not linked together by siloxane bonds, for the chemical mechanical polishing of a layer of semiconductor material such as polycrystalline silicon, epitaxial single-crystal silicon, amorphous silicon or isolating material such as phosphosilicate glass or borophosphosilicate glass used in the manufacture of integrated circuits, with the exception of the initial silicon used in the manufacture of wafers for integrated circuits, and a chemical mechanical polishing process for a layer of semiconductor material such as polycrystalline silicon, epitaxial single-crystal silicon, amorphous silicon or isolating material such as phosphosilicate glass or borophosphosilicate glass, used in the microelectronics industry of semiconductors, with the exception of the initial silicon used in the manufacture of wafers for integrated circuits, wherein an abrasion of the layer of semiconductor material of isolating material is carried out by rubbing the said layer with a fabric impregnated with an abrasive composition, characterised in that the abrasive comprises an aqueous suspension of neutral pH or of pH close to neutrality of colloidal silica preferably comprising individualised particles of colloidal silica, not linked together by siloxane bonds, and water as a suspension medium, and is notably essentially constituted of such an aqueous suspension of neutral pH or of pH close to neutrality.

This chemical mechanical polishing can take place at different stages in the manufacture of integrated circuits, in particular in the stage of lateral isolation of transistors, in the manufacture of transistor gates and in the manufacture of dielectric interconnections.

This chemical mechanical polishing can also take place on solid wafer or on wafer with reliefs in order to planarize the latter.

For the chemical mechanical polishing of layers of materials based on silicon, such as polycrystalline silicon, epitaxial silicon, or amorphous silicon, or materials based on doped silicon oxide such as phosphosilicate glass (or PSG) or borophosphosilicate glass (BPSG), the aqueous suspensions of colloidal silica used preferably have individual particle diameters of between 3 and 250 nm, and in particular between 10 and 100 nm.

Aqueous suspensions of colloidal silica preferred according to the invention are obtained either by neutralisation of alkaline soils of silica, in particular, of sodium or potassium, by means of an acid such as hydrochloric acid, nitric acid or sulphuric acid, or by neutralisation of an acid silica soil by means of soda, potash or ammonia, preferably by potash and ammonia, and especially by ammonia.

It has been noted that such suspensions of colloidal silica obtained by neutralisation of an acid soil by ammonia with a pH of 8, gave a good percentage of uniformity, whilst retaining a good speed of attack of the polycrystalline silicon, unlike what was mentioned in EP-A-0.363.100.

In preferred conditions of implementation of the process according to the invention, aqueous suspensions with a neutral pH or a pH close to neutrality of colloidal silica having a pH of between 6 and 8, and particularly between 6.5 and 7.5 are used.

In other preferred conditions of implementation of the process according to the invention, the diameters of the elementary particles of the suspensions of colloidal silica are between 3 and 250 nm, and particularly between 10 and 100 nm.

In yet other preferred conditions of implementation of the process according to the invention, the concentration by weight of the polishing product, that is to say of silica, is from 5 to 50%, preferably from 15 to 40%.

A principal advantage of the invention is the improvement in the uniformity of the chemical mechanical polishing of layers of semiconductor material such a polycrystalline silicon or isolation materials based on doped silicon oxide such as borophosphosilicate glass (BPSG) by the use of aqueous solutions of colloidal silica with a neutral pH or a pH close to neutrality.

This improvement can for example be essentially demonstrated by tests of the uniformity of attack of the polishing whilst retaining an acceptable speed of attack of the semiconductor material. This uniformity of attack of the polishing represents the variation in thickness of polycrystalline silicon over a same wafer. It is calculated by measuring the polycrystalline silicon over on a same wafer before and after polishing (see FIG. 1a and FIG. 1b) according to the following formula:

$$U = \frac{\text{Max thickness} - \text{Min thickness}}{2 \times \text{average thickness removed}} \times 100$$

The lower the value obtained, the more the uniformity of attack is satisfactory.

Another advantage of the invention is that the aqueous suspensions of neutral pH or of pH close to neutrality of colloidal silica, in particular consisting of individualised particles not linked together by siloxane bonds, have a very good stability over time, from which results the absence of sedimentation of particles during storage time.

Finally, a subject of the present application is an abrasive for the chemical mechanical polishing of a layer of semiconductor material based on silicon such as polycrystalline silicon, epitaxial silicon or amorphous silicon or isolators based on doped silicon oxide such as phosphosilicate glass (PSG) or borophosphosilicate glass (BPSG), with the exception of the initial silicon used in the manufacture of wafers for integrated circuits, comprising a fabric impregnated with liquid abrasive composition containing an aqueous suspension with neutral pH or a pH close to neutrality of colloidal silica, preferably comprising individualised particles not linked together by siloxane bonds, of diameter between 3 and 250 nanometers, of pH between 6 and 8.

Particularly preferred suspensions, developed by Company CLARIANT (FRANCE) S.A., are described below in the operating conditions of the process.

The following examples make it possible to understand the invention better.

EXAMPLE 1

Figure 1A:
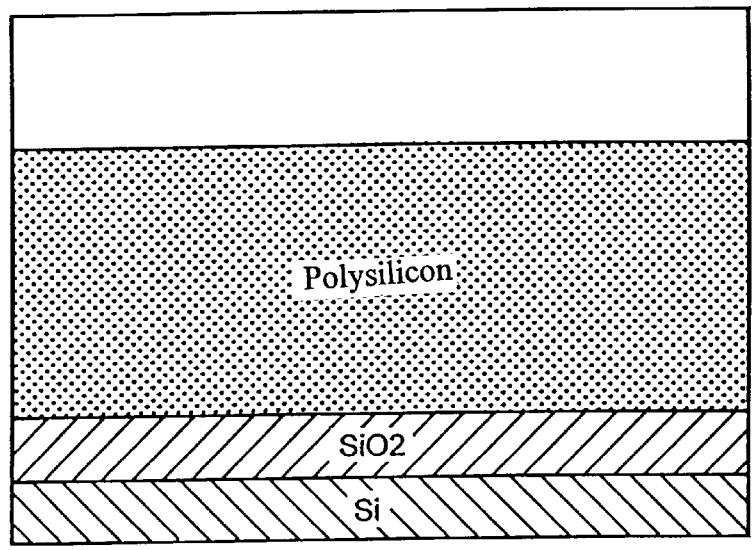
FIG. 1a shows the state of a solid wafer coated with polycrystalline silicon before polishing, whilst
Figure 1B:
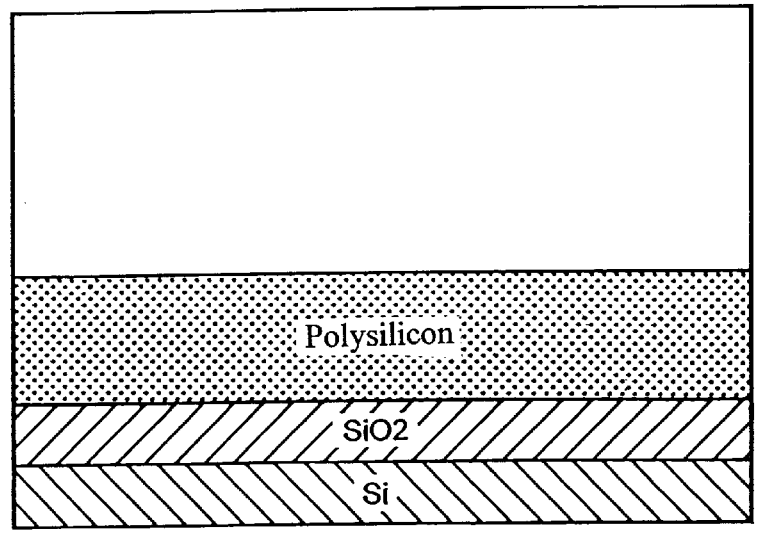
FIG. 1b shows the state of this wafer after polishing.
Figure 1C:
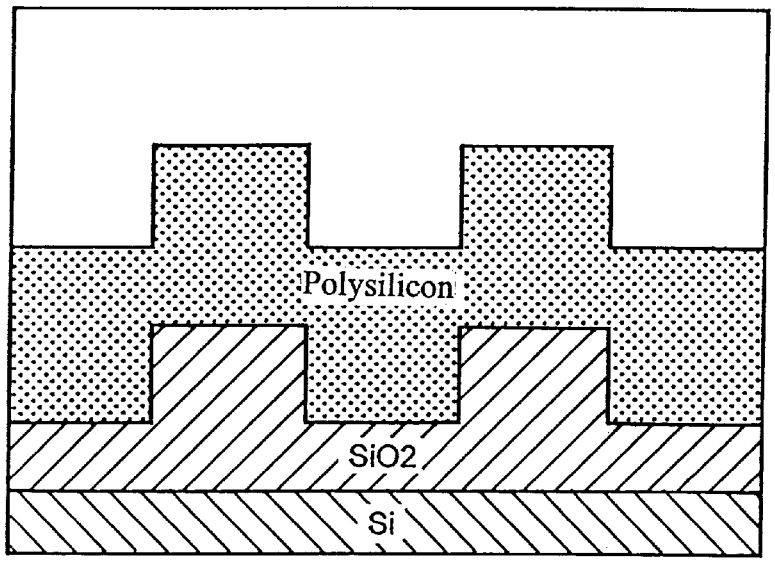
FIGS. 1c and 1d show the state of a similar wafer but with reliefs. These reliefs have been caused by photolithographic etching.
Figure 1D:
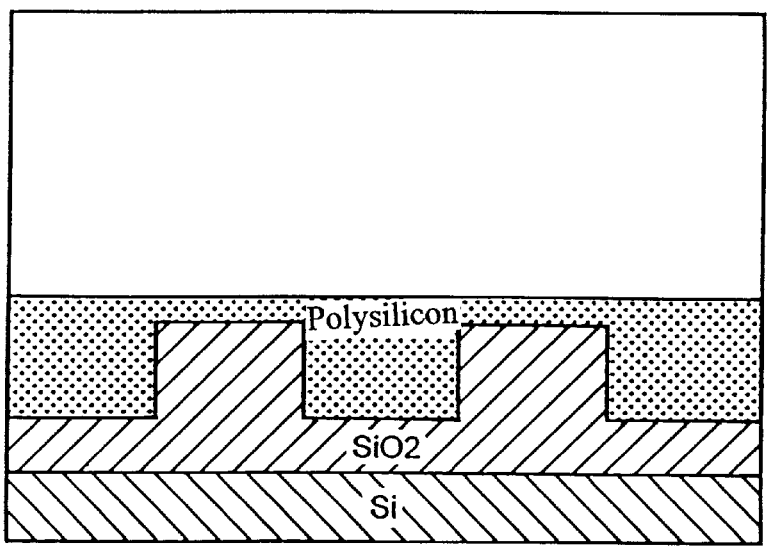

Example of polishing with abrasives based on aqueous suspensions with neutral pH of colloidal silica.

On each of the studied wafers a deposit of polycrystalline silicon is produced having a thickness of about 0.4 μm which is measured before and after polishing.

The wafer is then polished using the following standard process:

load force: 0.7 daN/cm$^2$ plate speed: 40 r.p.m.

carrier speed: 45 r.p.m.

temperature: 20° C.

abrasive throughput: 50 cm$^3$/min fabric: IC 1400 on Suba 4 from RODEL PRODUCTS With a colloidal silica whose characteristics are as follows:

pH of the aqueous suspension: 7 average diameter of the elementary particles of colloidal silica: 50 nm

Concentration of colloidal silica by weight: 30%

The following is obtained:

a percentage of uniformity of 4% a speed of attack of polycrystalline silicon of 1300 Å/min

EXAMPLE 2

Examples of polishing with abrasives based on aqueous suspensions of colloidal silica close to neutrality.

Under the same conditions as those described in Example 1 and using the same colloidal silicas and varying only the pH, the following results are obtained:

a) with pH 6
   a percentage of uniformity of 4.6%
   a speed of attack of polycrystalline silicon of 820 Å/min b) with pH 8
   a percentage of uniformity of 6%
   a speed of attack of polycrystalline silicon of 1950 Å/min

EXAMPLE 3

Example of polishing borophosphosilicate glass (BPSG) with a boron concentration of 4.4% and a phosphorus concentration of 4.7% with abrasives based on aqueous suspensions of colloidal silica with neutral pH.

Under the same conditions as those described in Example 1 and using the same colloidal silicas and varying only the pH, the following results are obtained:

a percentage of uniformity of 3.9% a speed of attack of BPSG of 5560 Å/min

Experiment 1:

Example of polishing with abrasives based on basic aqueous suspensions of colloidal silica.

Under the same conditions as those described in Example 1 and using the same colloidal silicas but applying them in a basic medium, the following results are obtained:

a) with pH 10
   a percentage of uniformity of 18%
   a speed of attack of polycrystalline silicon of 3550 Å/min b) with pH 11
   a percentage of uniformity of 30%
   a speed of attack of polycrystalline silicon of 7088 Å/min Experiment 2:

Example of polishing with abrasives based on acidic aqueous suspensions of colloidal silica.

Under the same conditions as those described in Example 1 and using the same colloidal silicas but applying them in an acidic medium having a pH of 2.2, the following results are obtained:

a percentage of uniformity of 8% a speed of attack of polycrystalline silicon of 470 Å/min

Experiment 3:

Example of polishing borophosphosilicate glass (BPSG) having a boron concentration of 4.4% and a phosphorus concentration of 4.7% with abrasives based on basic aqueous suspensions of colloidal silica.

Under the same conditions as those described in Example 1 and using the same colloidal silicas but applying them in a basic medium having a pH of 10, the following results are obtained:

a percentage of uniformity of 12% a speed of attack of the BPSG of 451 Å/min

Experiment 4:

Example of polishing borophosphosilicate glass (BPSG) having a boron concentration of 4.4% and a phosphorus concentration of 4.7% with abrasives based on basic aqueous suspensions of colloidal silica.

Under the same conditions as those described in Example 1 and using the same colloidal silicas but applying them in an acidic medium having a pH of 2.5, the following results are obtained:

a percentage of uniformity of 7.9% a speed of attack of the BPSG of 2770 Å/min

It is therefore observed that the use of suspensions of colloidal silica having a neutral pH or a pH close to neutral makes it possible to obtain a good uniformity of polishing both on polycrystalline silicon and on BPSG whilst retaining a good speed of attack, a very good surface state of the wafer and excellent planarization.

We claim:

1. Chemical mechanical polishing process for a layer of semiconductor material, with the exception of the initial silicon used in the manufacture of wafers for integrated circuits, in which an abrasion of the layer of semiconductor material or isolating material is carried out by rubbing the said layer with a fabric impregnated with an abrasive composition, characterised in that the abrasive consists essentially of an aqueous suspension having a pH between 6 and 7.5 of colloidal silica which comprises individualised particles of colloidal silica, not linked together by siloxane bonds, and water as the suspension medium.

2. Chemical mechanical polishing process according to claim 1, characterised in that the abrasive essentially consists of an aqueous suspension having a neutral pH or a pH close to neutrality.

3. Process according to claim 1, characterised in that the aqueous suspension of colloidal silica has a pH between 6.5 and 7.5.

4. Process according claim 1 characterised in that the individualised particles of colloidal silica not linked together by siloxane bonds have diameters between 3 and 250 nanometres.

5. Process according to claim 4, characterised in that the individualised particles of colloidal silica not linked together by siloxane bonds have diameters between 10 and 100 nanometers.

6. Process according to claim 5, characterised in that the aqueous suspension of colloidal silica is used at a silica concentration by weight of between 15 and 40%.

7. Process according to claim 4, characterised in that the aqueous suspension of colloidal silica is used at a silica concentration by weight of between 5 and 50%.

8. Process according to claim 7, characterised in that the aqueous suspension of colloidal silica is used at a silica concentration by weight of between 15 and 40%.

9. Process according to claims 1 characterised in that the aqueous suspension of colloidal silica is used at a silica concentration by weight of between 5 and 50%.

10. Process according to claim 9, characterised in that the aqueous suspension of colloidal silica is used at a silica concentration by weight of between 15 and 40%.

11. Process according to claim 1, characterised in that the semiconductor material is based on polycrystalline silicon, epitaxial silicon, amorphous silicon or based on a doped silicon oxide selected from the group consisting of phosphosilicate glass (PSG) and borophosphosilicate glass (BPSG).

12. Process according to claim 11, characterised in that the layer of semiconductor material is based on polycrystalline silicon.

13. The process of claim 1, wherein said layer of semiconductor material being polished is selected from the group consisting of polycrystalline silicon, epitaxial single-crystal silicon and amorphous silicon.

14. An abrasive fabric for the chemical mechanical polishing of a layer of semiconductor material of polycrystalline silicon, epitaxial silicon or amorphous silicon based on doped silicon oxide of phosphosilicate glass (PSG) or borophosphosilicate glass (BPSG), comprising a fabric impregnated with an abrasive liquid composition containing an aqueous suspension with a pH between 6 and 7.5 of colloidal silica comprising individualised particles not linked together by siloxane bonds, of diameter between 3 and 250 nanometers.

15. The abrasive fabric of claim 14, wherein said pH is between 6.5 and 7.5 and the particles of colloidal silica have diameters between 10 and 100 nanometers.

* * * * *